United States Patent
Nikipelov et al.

(10) Patent No.: US 11,287,747 B2
(45) Date of Patent: Mar. 29, 2022

(54) END FACET PROTECTION FOR A RADIATION SOURCE AND A METHOD FOR USE IN METROLOGY APPLICATIONS

(71) Applicant: ASML NETHERLANDS B.V., Veldhoven (NL)

(72) Inventors: Andrey Nikipelov, Eindhoven (NL); Patrick Sebastian Uebel, Marloffstein (DE); Amir Abdolvand, Eindhoven (NL); Sebastian Thomas Bauerschmidt, Wendelstein (DE); Peter Maximilian Götz, Altdorf (DE); Natallia Eduardauna Uzunbajakava, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/983,264

(22) Filed: Aug. 3, 2020

(65) Prior Publication Data
US 2021/0063893 A1    Mar. 4, 2021

(30) Foreign Application Priority Data

Aug. 29, 2019   (EP) .................................... 19194369
Oct. 21, 2019   (EP) .................................... 19204339
May 18, 2020   (EP) .................................... 20175193

(51) Int. Cl.
     *G03F 7/20*           (2006.01)

(52) U.S. Cl.
     CPC .......... *G03F 7/70616* (2013.01); *G03F 7/705* (2013.01)

(58) Field of Classification Search
     CPC .. G03F 7/70616; G03F 7/705; G03F 7/70041; G03F 7/70575; G03F 7/70916;
(Continued)

(56) References Cited

U.S. PATENT DOCUMENTS 6,961,116 B2    11/2005   Den Boef et al.
7,373,062 B2    5/2008    Huber
(Continued)

FOREIGN PATENT DOCUMENTS

CA          2961847        9/2018
EP          1628164        2/2006
(Continued)

OTHER PUBLICATIONS

International Search Report and Written Opinion issued in corresponding PCT Patent Application No. PCT/EP2020/071424, dated Oct. 13, 2020.
(Continued)

*Primary Examiner* — Mesfin T Asfaw

(74) *Attorney, Agent, or Firm* — Pillsbury Winthrop Shaw Pittman LLP

(57) ABSTRACT

A system and method for providing a radiation source is disclosed. In one arrangement, the radiation source includes a gas cell having a window, an optical fiber that is hollow and has an axial direction, an end thereof being enclosed within the gas cell and optically coupled to the window via an optical path, and a surface, disposed around the end of the optical fiber, and extending past the end of the optical fiber in the axial direction towards the window so as to limit one or more selected from: the exchange of gas between the optical path and the remainder of the gas cell, ingress of plasma towards or into the optical fiber, and/or radical flux towards etch-susceptible surfaces.

20 Claims, 8 Drawing Sheets

(58) Field of Classification Search
CPC .. G02B 6/02328; G02B 6/032; G02B 6/0239;
G02B 6/02; G02B 6/024; G02B 6/3624;
G02B 6/02304; G02F 1/3501; G02F
1/095; G02F 1/3513; G01N 21/68; G01N
21/39; G01N 21/3504; H01L 21/67253;
H05G 2/005; H05G 2/003; H05G 2/008;
H01J 37/32935; H01J 37/32972; B08B
7/0057; H01S 3/0057
See application file for complete search history.

(56) References Cited

U.S. PATENT DOCUMENTS

| | | | |
|---|---|---|---|
| 9,160,137 | B1 | 10/2015 | Abdolvand et al. |
| 2004/0015085 | A1 | 1/2004 | Soh et al. |
| 2009/0195768 | A1 | 8/2009 | Bijnen et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2012/0082410 | A1* | 4/2012 | Peng .................. G02B 6/02304 385/11 |
| 2014/0334763 | A1 | 11/2014 | Holzer et al. |
| 2015/0261097 | A1 | 9/2015 | Mathijssen et al. |
| 2016/0161863 | A1 | 6/2016 | Den Boef et al. |
| 2016/0370717 | A1 | 12/2016 | Den Boef et al. |
| 2018/0156715 | A1 | 6/2018 | Francis et al. |
| 2018/0364036 | A1 | 12/2018 | Jak et al. |

FOREIGN PATENT DOCUMENTS

| | | |
|---|---|---|
| EP | 2942847 | 11/2015 |
| EP | 3136143 | 3/2017 |
| EP | 3404454 | 11/2018 |
| TW | 201905588 | 2/2019 |
| WO | 2017032454 | 3/2017 |
| WO | 2018127266 | 2/2018 |

OTHER PUBLICATIONS

Russell, P. St. J. et al . . . : "Hollow-core photonic crystal fibres for gas-based nonlinear optics", Nature Photonics, vol. 8, Apr. 2014.
European Search Report issued on corresponding European Application No. 19204339.6, dated Apr. 8, 2020.
Taiwanese Office Action issued in corresponding Taiwanese Patent Application No. 109128527, dated Apr. 21, 2021.
European Search Report issued in corresponding European Patent Application No. 20188435, dated Jan. 14, 2021.

* cited by examiner

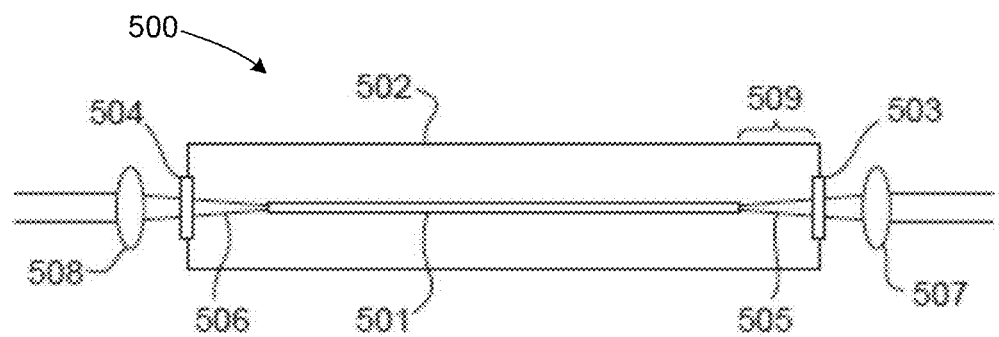
Fig. 5
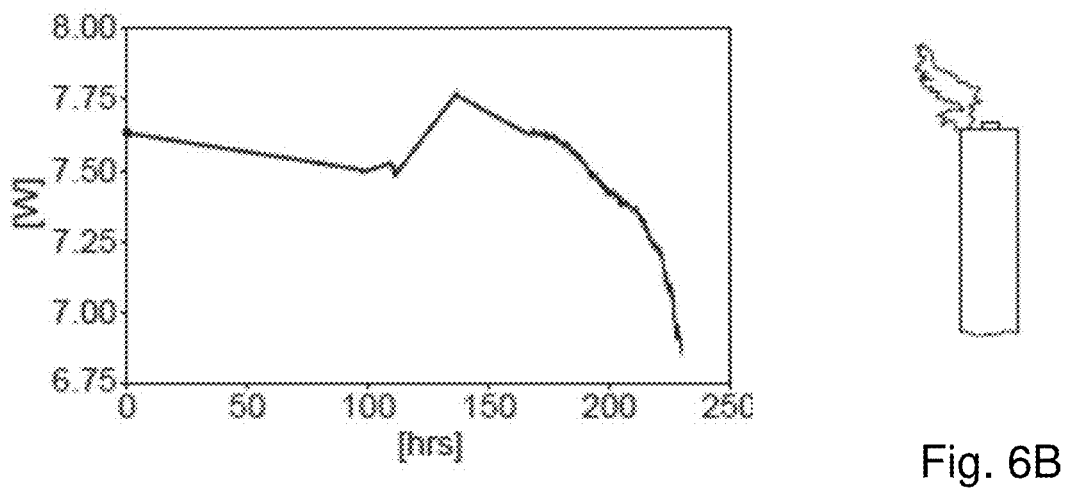
Fig. 6A
Fig. 6B
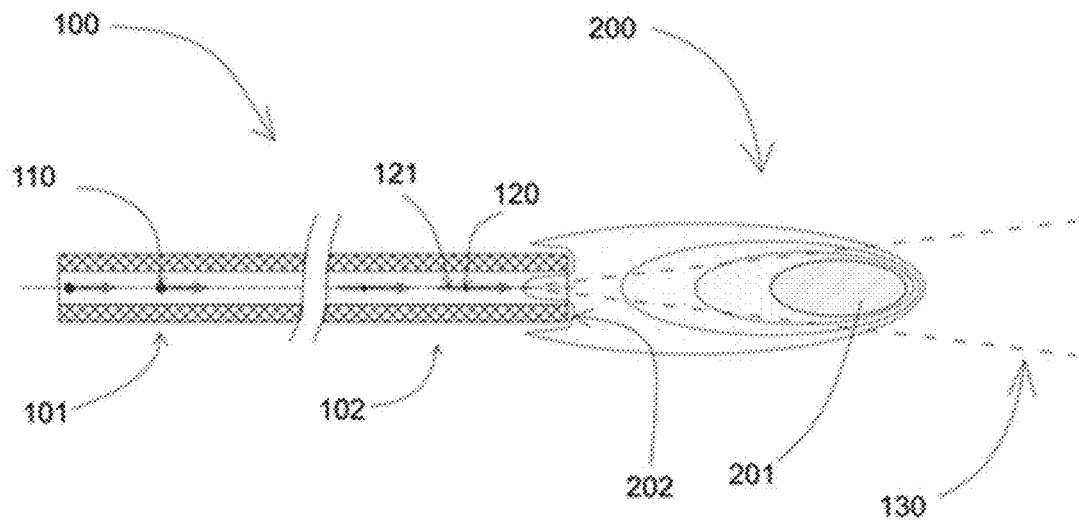
Fig. 6C

END FACET PROTECTION FOR A RADIATION SOURCE AND A METHOD FOR USE IN METROLOGY APPLICATIONS

The present application claims the benefit of priority of European patent application no. 19194369.5, filed Aug. 29, 2019, of European patent application no. 19204339.6, filed Oct. 21, 2019, and of European patent application no. 20175193.0, filed May 18, 2020, each of the foregoing applications is incorporated herein in its entirety by reference.

FIELD

The present description relates to a radiation source and a method for operating the radiation source, in particular, a broadband radiation source for use in a lithographic apparatus or a metrology tool.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

SUMMARY

A metrology apparatus can be used to measure one or more parameters of interest of structures on the substrate. For example, a metrology apparatus can be used to measure a parameter such as critical dimension, overlay between layers on the substrate and/or asymmetry of a pattern on the substrate. Rays of measurement radiation are used to illuminate the substrate. The radiation is diffracted by the structure on the substrate. The diffracted radiation is collected by an objective lens and captured by a sensor.

The rays of measurement radiation are provided by radiation emitted by a radiation source. This radiation is directed onto the substrate via, e.g., a beam splitter and the objective lens that collects the diffracted radiation from the substrate.

The radiation source providing measurement radiation (e.g., light) may be a broadband radiation source (e.g., white light). The broadband radiation source may be generated using a gas-filled optical fiber. A laser source may be coupled to the input of the optical fiber of the radiation source, and be spectrally broadened in the optical fiber.

Both a very high spectral power density of such a radiation source and plasma generated as a by-product of radiation generation bear a risk of damaging of the material of a hollow core photonic crystal fiber (HC-PCF). Thus, it is desirable, for example, to provide a radiation source that has an increased operable lifetime. In particular, it is desirable to provide, for example, a radiation source comprising a gas-filled hollow-core photonic crystal fiber that produces less contaminant material during operation. It is desirable, for example, that the original and desired spectral and power output and mode content is preserved.

According to an aspect, there is provided a radiation source, comprising: a gas cell having a window; an optical fiber that is hollow, an end thereof being enclosed within the gas cell and optically coupled to the window via an optical path; a surface, disposed around and extending past the end of the optical fiber towards the window so as to limit one or more selected from: the exchange of gas between the optical path and the remainder of the gas cell; ingress of plasma towards or into the optical fiber; and/or radical flux towards etch-susceptible surfaces.

According to an aspect, there is provided a metrology device comprising a radiation source as described herein, wherein the radiation source is configured to generate radiation for projection onto a substrate.

BRIEF DESCRIPTION OF THE DRAWINGS

Embodiments of the invention will now be described, by way of example only, with reference to the accompanying schematic drawings, in which:

FIG. 5 depicts a schematic of a HC-PCF based radiation source with a gas cell;

FIG. 6A depicts experimental results for the average output power of a HC-PCF based radiation source against total operation time;

FIG. 6B depicts a schematic example of the end of a HC-PCF with a contamination growth;

FIG. 6C depicts a possible mechanism for the formation of the contamination growth depicted in FIG. 6B;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1A:
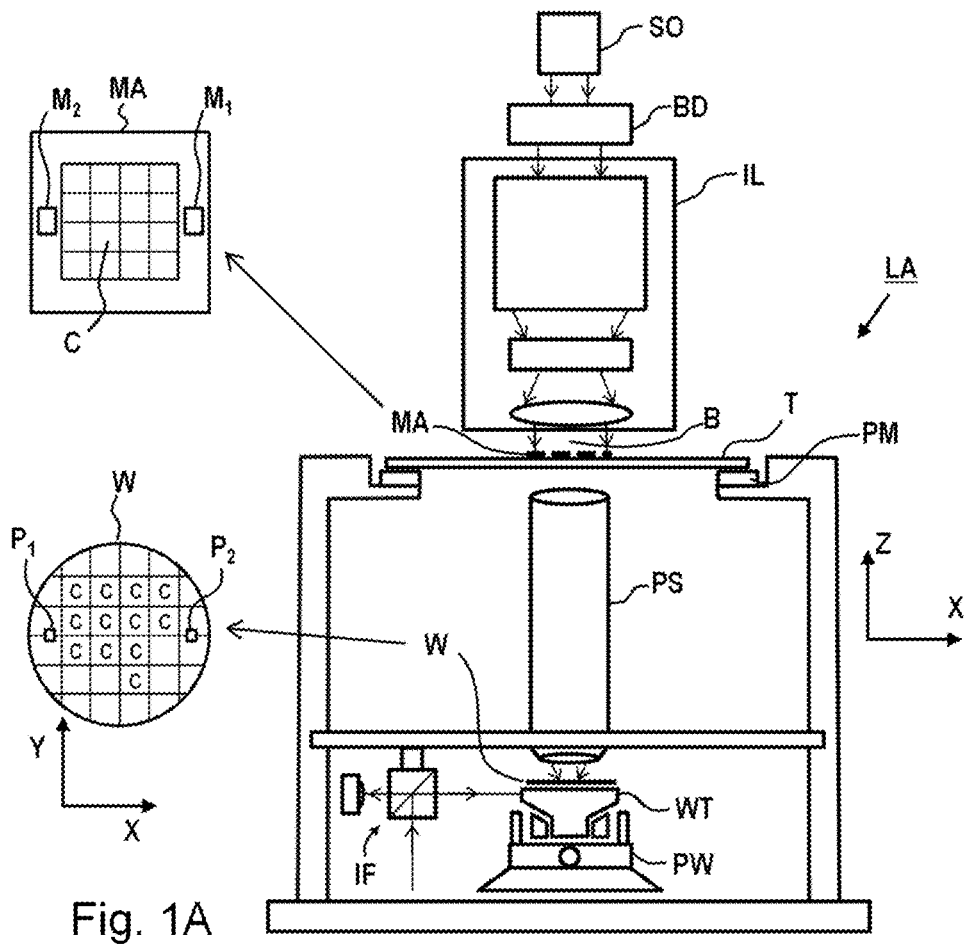
FIG. 1A depicts a schematic overview of lithographic apparatus.

FIG. 1A schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1A) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 1B:
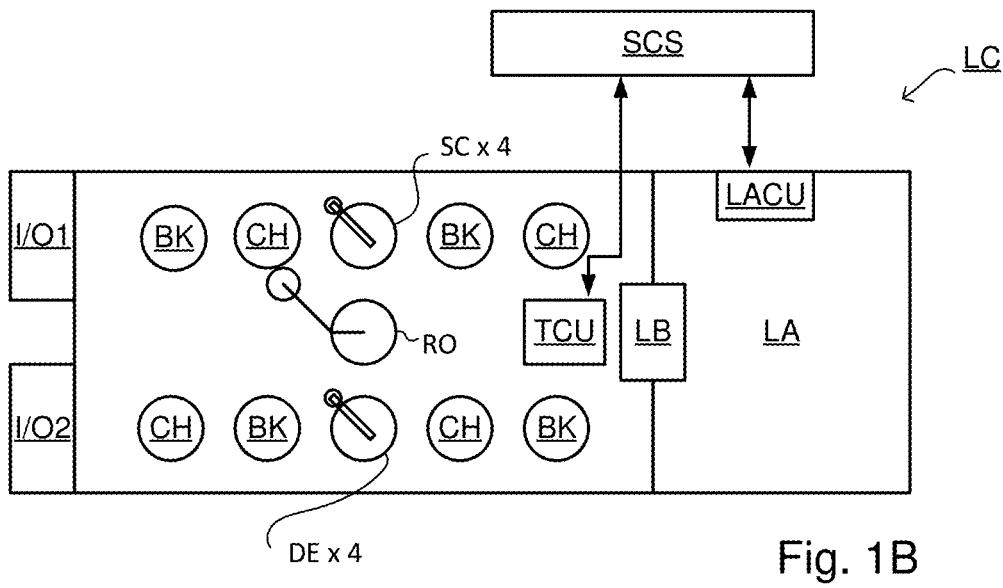
FIG. 1B depicts a schematic overview of a lithographic cell.

As shown in FIG. 1B the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 2:
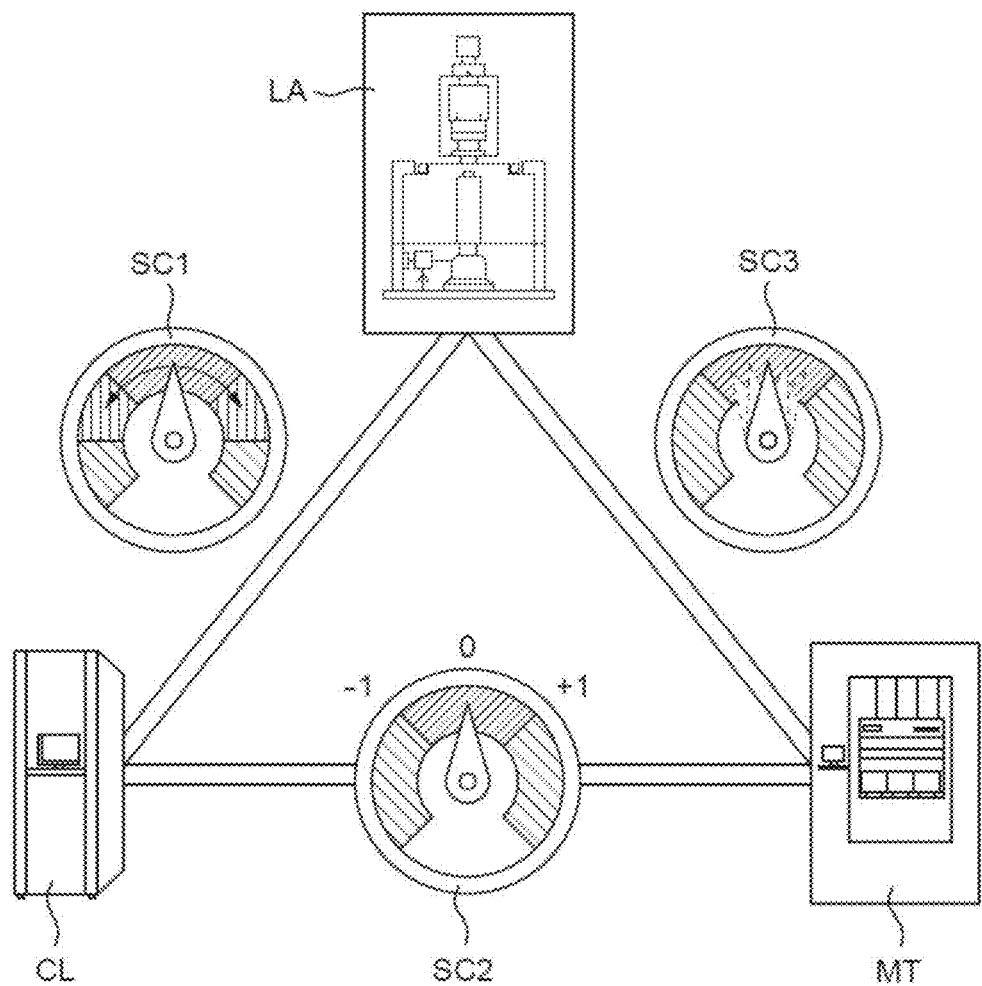
FIG. 2 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 2. One of these systems is the lithographic apparatus LA which is (virtually) connected to a metrology tool MT (a second system) and to a computer system CL (a third system). A goal of such a "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 2 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 2 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 2 by the multiple arrows in the third scale SC3).

In lithographic processes, it is desirable to make frequently measurements of the structures created, e.g., for process control and verification. Different types of metrology apparatus MT for making such measurements are known, including scanning electron microscopes or various forms of scatterometer metrology apparatus MT.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. patent application publication nos. US20100328655, US2011102753A1, US20120044470A, US20110249244, US20110026032 and in European patent application publication no. EP1,628,164A, each of the foregoing patent application publications incorporated herein in its entirety by reference. Aforementioned scatterometers may measure gratings using radiation from an embodiment of a radiation source discussed in this document.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. patent application publication nos. US2016-0161863 and US 2016/0370717, each incorporated herein in its entirety by reference. The radiation sources of this document may be configured to be controllable in respect to the radiation source requirements of these substrate measurement recipes.

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116, which is incorporated herein in its entirety by reference. Various enhancements and modifications of the position sensor have been developed, for example as disclosed in U.S. patent application publication no. US 2015-261097, which is incorporated herein in its entirety by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in U.S. patent application publication no. US2009/195768, which is incorporated herein in its entirety by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3A:
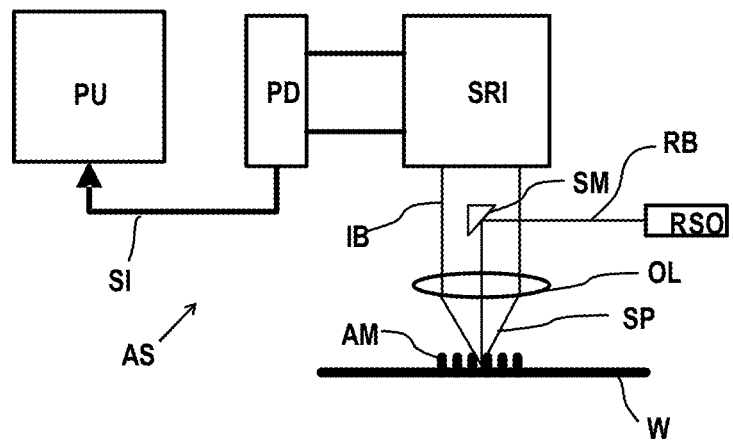
FIG. 3A depicts a schematic block diagram of an alignment sensor.

FIG. 3A is a schematic block diagram of an embodiment of an alignment sensor AS, such as is described, for example, in U.S. Pat. No. 6,961,116, which is incorporated herein in its entirety by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The radiation source RSO may be provided by an embodiment of a radiation source of the disclosure of this document. The illumination spot SP, by which the mark AM is illuminated, may be slightly smaller in width (e.g. diameter) than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD, which photodetector outputs a signal SI to a processing unit PU configured to obtain or determine alignment from the signal SI. Additional optics (not shown) may be included to provide separate beams in case more than one wavelength is created by the radiation source RSO. The photodetector may be a single element, or it may comprise a number of pixels, if desired. The photodetector may comprise a sensor array.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 3B:
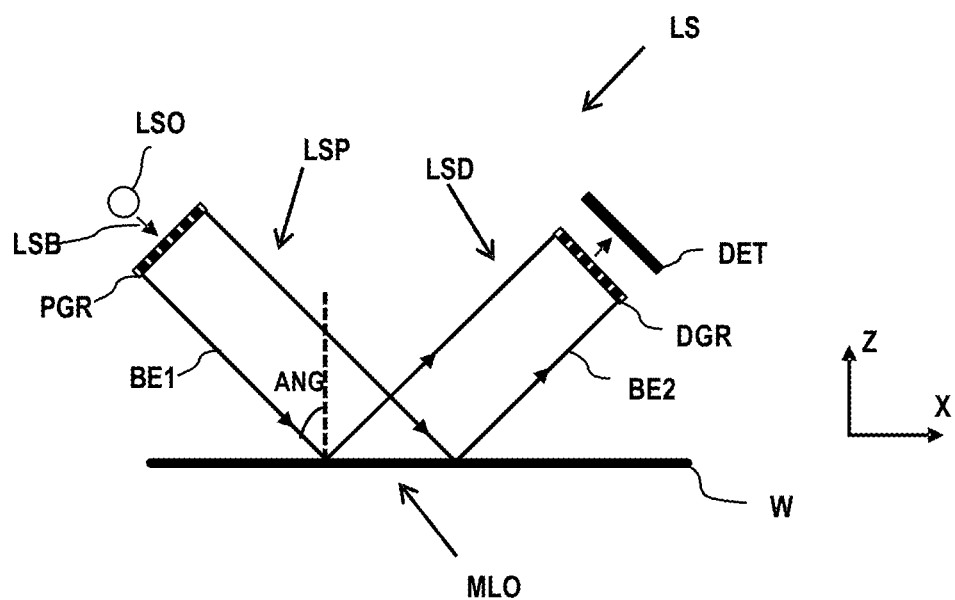
FIG. 3B depicts a schematic block diagram of a level sensor.

An example of a level or height sensor LS is schematically shown in FIG. 3B, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may comprise an embodiment of the disclosure of this document. The beam BE1 from projection grating PGR is incident on the substrate W at angle ANG and at a measurement spot MLO. Radiation BE2 redirected by the substrate W is incident on a detector grating DGR. The radiation from detector grating DGR is incident on a detector DET, which is able to produce a signal representative of the height.

The present disclosure is directed towards, for example, improving the operable lifetime of a radiation source, in particular, the operable lifetime of a radiation source (e.g., a broadband radiation (e.g., white light) source) comprising a hollow-core photonic crystal fiber (HC-PCF). The radiation source of the present disclosure may be used in a metrology tool such as a scatterometer, an alignment sensor, and/or a height or level sensors as described above.

Metrology tools MT, such as a scatterometer, topography measurement system, or position measurement system mentioned above, may use radiation originating from a radiation source to perform a measurement. One or more properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a target with no or minimal interference with other frequencies. Therefore different frequencies may for example be used to obtain more metrology data simultaneously. Different radiation frequencies may also be able to interrogate and discover different properties of a metrology target. Broadband radiation may be useful in metrology systems MT such as for example level sensors, alignment mark measurement systems, scatterometry tools, or inspection tools. A broadband radiation source may be a supercontinuum source.

High quality broadband radiation, for example supercontinuum radiation, may be difficult to generate. One method for generating a certain type of radiation, such as broadband radiation, may be to broaden high-power narrow band or single frequency input radiation, for example making use of non-linear, higher order effects. The input radiation (which may be produced using a laser) may be referred to as pump radiation. Alternatively, the input radiation may be referred to as seed radiation. To obtain high power radiation for broadening effects, radiation may be confined into a small area so that strongly localized high intensity radiation is achieved. In those areas, the radiation may interact with broadening structures and/or materials forming a non-linear medium so as to create broadened output radiation. In the high intensity radiation areas, different materials and/or structures may be used to enable and/or improve radiation broadening by providing a suitable non-linear medium.

In some implementations, the broadened output radiation is created in a photonic crystal fiber (PCF). In several embodiments, such a photonic crystal fiber has microstructures around its fiber core assisting in confining radiation that travels through the fiber in the fiber core. The fiber core can be made of a solid material that has non-linear properties and that is capable of generating broadened radiation when high intensity pump radiation is transmitted through the fiber core. Although it is feasible to generate broadened radiation in solid core photonic crystal fibers, there may be a few disadvantages of using a solid material. For example, if UV radiation is generated in the solid core, this radiation might not be present in the output spectrum of the fiber because the radiation is absorbed by most solid material.

In some implementations, as discussed further below with reference to FIG. 4B, methods and apparatuses for broadening input radiation may use a fiber for confining input radiation, and for broadening the input radiation to output broadened radiation. The fiber may be a hollow core fiber, and may comprise internal structures to achieve effective guiding and confinement of radiation in the fiber. The fiber may be a hollow core photonic crystal fiber (HC-PCF), which is particularly suitable for strong radiation confinement, predominantly inside the hollow core of the fiber, achieving high radiation intensities. The hollow core of the fiber may be filled with a gas or gas mixture acting as a broadening medium for broadening input radiation. Such a fiber and gas mixture arrangement may be used to create a supercontinuum radiation source. Radiation input to the fiber may be electromagnetic radiation, for example radiation in one or more selected from: the infrared, visible, UV, and/or extreme UV spectra. The output radiation may consist of or comprise broadband radiation, which may be referred to herein as white light. The output radiation may cover the UV, visible and/or near-infrared range (and/or parts thereof). The exact spectrum and power density of the output radiation will be determined by plurality of parameters, such as fiber structure, gas mix composition, gas pressure, energy of the input radiation, pulse duration and pulse shape of the input radiation.

Some embodiments relate to a new design of such a radiation source comprising an optical fiber. The optical fiber is a hollow-core, photonic crystal fiber (HC-PCF). In particular, the optical fiber may be a hollow-core, photonic crystal fiber of a type comprising anti-resonant structures for confinement of radiation. Such fibers comprising anti-resonant structures are known in the art as anti-resonant fibers, tubular fibers, single-ring fibers, negative curvature fibers or inhibited coupling fibers. Various different designs of such fibers are known in the art. Alternatively, the optical fiber may be a photonic bandgap fiber (HC-PBF), for example a Kagome fiber.

Figure 4A:
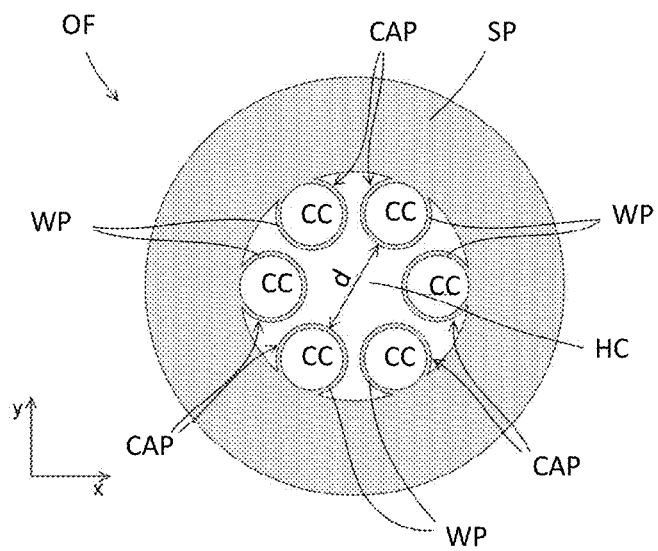
FIG. 4A is a schematic cross sectional view of a hollow core optical fiber that may form part of a radiation source according to an embodiment in a transverse plane (i.e. perpendicular to an axis of the optical fiber)

A number of types of HC-PCFs can be engineered, each based on a different physical guidance mechanism. Two such HC-PCFs include: hollow-core photonic bandgap fibers (HC-PBFs) and hollow-core anti-resonant reflecting fibers (HC-ARFs). Detail on the design and manufacture of HC-PCFs can be found in U.S. patent application publication no. US2004/015085 (for HC-PBFs) and PCT patent application publication no. WO2017/032454 (for hollow core anti-resonant reflecting fibers), each of which is incorporated herein in its entirety by reference. FIG. 4C shows a Kagome fiber, comprising a Kagome lattice structure.

An example of an optical fiber for use in the radiation source is now described with reference to FIG. 4A, which is a schematic cross sectional view of the optical fiber OF in a transverse plane. Further embodiments similar to the practical example of the fiber of FIG. 4A are disclosed in PCT patent application publication no. WO2017/032454.

The optical fiber OF comprises an elongate body, which is longer in one dimension compared to the other two dimensions of the fiber OF. This longer dimension may be referred to as an axial direction and may define an axis of the optical fiber OF. The two other dimensions define a plane which may be referred to as a transverse plane. FIG. 4A shows a cross-section of the optical fiber OF in this transverse plane (i.e. perpendicular to the axis), which is labelled as the x-y plane. The transverse cross-section of the optical fiber OF may be substantially constant along the fiber axis.

It will be appreciated that the optical fiber OF has some degree of flexibility and therefore the direction of the axis will not, in general, be uniform along the length of the optical fiber OF. The terms such as the optical axis, the transverse cross-section and the like will be understood to mean the local optical axis, the local transverse cross-section and so on. Furthermore, where components are described as being cylindrical or tubular these terms will be understood to encompass such shapes that may have been distorted as the optical fiber OF is flexed.

The optical fiber OF may have any length and it will be appreciated that the length of the optical fiber OF may be dependent on the application. The optical fiber OF may have a length between 1 cm and 10 m, or 0.1 cm and 10 m for example, the optical fiber OF may have a length between 10 cm and 100 cm.

The optical fiber OF comprises: a hollow core HC; a cladding portion surrounding the hollow core HC; and a support portion SP surrounding and supporting the cladding portion. The optical fiber OF may be considered to comprise a body (comprising the cladding portion and the support portion SP) having a hollow core HC. The cladding portion comprises a plurality of anti-resonance elements for guiding radiation through the hollow core HC. In particular, the plurality of anti-resonance elements are arranged to confine radiation that propagates through the optical fiber OF predominantly inside the hollow core HC and to guide the radiation along the optical fiber OF. The hollow core HC of the optical fiber OF may be disposed substantially in a central region of the optical fiber OF, so that the axis of the optical fiber OF may also define an axis of the hollow core HC of the optical fiber OF.

The cladding portion comprises a plurality of anti-resonance elements for guiding radiation propagating through the optical fiber OF. In particular, in this embodiment, the cladding portion comprises a single ring of tubular capillaries CAP (in this example, six). Each of the tubular capillaries CAP acts as an anti-resonance element.

The capillaries CAP may also be referred to as tubes. The capillaries CAP may be circular in cross section, or may have another shape. Each capillary CAP comprises a generally cylindrical wall portion WP that at least partially defines the hollow core HC of the optical fiber OF and separates the hollow core HC from a capillary cavity CC. It will be appreciated that the wall portion WP may act as an anti-reflecting Fabry-Perot resonator for radiation that propagates through the hollow core HC (and which may be incident on the wall portion WP at a grazing incidence angle). The thickness of the wall portion WP may be suitable so as to ensure that reflection back into the hollow core HC is generally enhanced whereas transmission into the capillary cavity CC is generally suppressed. In some embodiments, the capillary wall portion WP may have a thickness between 0.01-10.0 µm.

It will be appreciated that, as used herein, the term cladding portion is intended to mean a portion of the optical fiber OF for guiding radiation propagating through the optical fiber OF (i.e. the capillaries CAP which confine the radiation within the hollow core HC). The radiation may be confined in the form of transverse modes, propagating along the fiber axis.

The support portion is generally tubular and supports the capillaries CAP of the cladding portion. The capillaries CAP are distributed evenly around an inner surface if the inner support portion SP. The capillaries CAP may be described as being disposed in a generally hexagonal formation.

In an embodiment, the capillaries CAP are arranged so that each capillary is not in contact with any of the other capillaries CAP. Each of the capillaries CAP is in contact with the inner support portion SP and spaced apart from adjacent capillaries CAP in the ring structure. Such an arrangement may be beneficial since it may increase a transmission bandwidth of the optical fiber OF (relative, for example, to an arrangement wherein the capillaries are in contact with each other). Alternatively, in some embodiments, each of the capillaries CAP may be in contact with adjacent capillaries CAP in the ring structure.

The capillaries CAP of the cladding portion are disposed in a ring structure around the hollow core HC. An inner surface of the ring structure of capillaries CAP at least partially defines the hollow core HC of the optical fiber OF. The width (e.g., diameter) d of the hollow core HC (which may be defined as the smallest dimension between opposed capillaries, indicated by arrow d) may be between 10 and 1000 µm. The width d of the hollow core HC may affect the mode field diameter, impact loss, dispersion, modal plurality, and one or more non-linearity properties of the hollow core optical fiber OF.

In this embodiment, the cladding portion comprises a single ring arrangement of capillaries CAP (which act as anti-resonance elements). Therefore, a line in any radial direction from a center of the hollow core HC to an exterior of the optical fiber OF passes through no more than one capillary CAP.

It will be appreciated that other embodiments may be provided with different arrangements of anti-resonance elements. These may include arrangements having multiple rings of anti-resonance elements and arrangements having nested anti-resonance elements. Furthermore, although the embodiment shown in FIG. 4A comprises a ring of six capillaries, in other embodiments, one or more rings comprising any number of anti-resonance elements (for example 4, 5, 6, 7, 8, 9, 10, 11 or 12 capillaries) may be provided in the cladding portion.

Figure 4B:
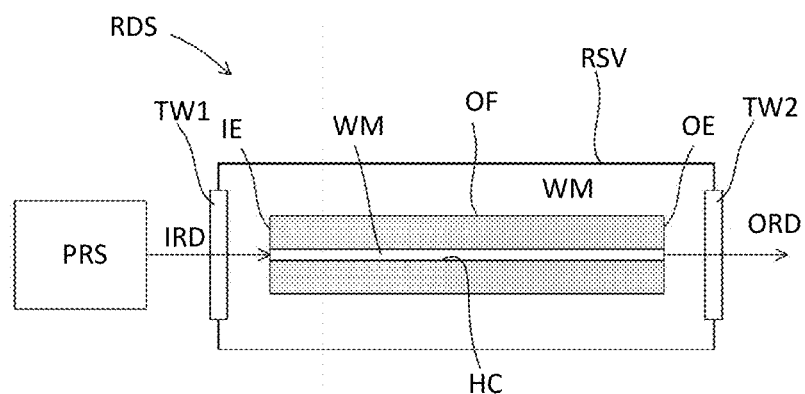
FIG. 4B depicts a schematic representation of a radiation source according to an embodiment for providing broadband output radiation.
Figure 4C:
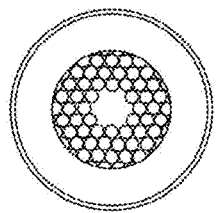
FIG. 4C schematically depicts the transverse cross-section of an example of a hollow core photonic crystal fiber (HC-PCF) design for supercontinuum generation, which may form part of a radiation source according to an embodiment.
Figure 4D:
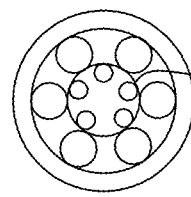
FIG. 4D schematically depicts the transverse cross-section of an example of a hollow core photonic crystal fiber (HC-PCF) design for supercontinuum generation, which may form part of a radiation source according to an embodiment.

FIG. 4D shows a modified embodiment of the above discussed HC-PCFs with a single ring of tubular capillaries. In the example of FIG. 4D there are two coaxial rings of tubular capillaries. For holding the inner and outer rings of tubular capillaries, a support tube ST may be included in the HC-PCF. The support tube may be made of silica.

The tubular capillaries of the examples of FIGS. 4A, 4C and 4D may have a circular cross-sectional shape. Other shapes are also possible for the tubular capillaries, like elliptical or polygonal cross-sections. Additionally, the solid material of the tubular capillaries of the examples of FIGS. 4A, 4C and 4D may comprise plastic material, like PMA, glass, like silica, or soft glass.

FIG. 4B depicts a radiation source RDS for providing broadened output radiation. The radiation source RDS comprises a pulsed pump radiation source PRS or any other type of source that is capable of generating short pulses of a desired length and energy level; an optical fiber OF (for example of the type shown in FIG. 4A) with a hollow core HC; and a working medium WM (for example a gas) disposed within the hollow core HC. Although in FIG. 4B the radiation source RDS comprises the optical fiber OF shown in FIG. 4A, in alternative embodiments other types of hollow core optical fiber may be used.

The pulsed pump radiation source PRS is configured to provide input radiation IRD. The hollow core HC of the optical fiber OF is arranged to receive the input radiation IRD from the pulsed pump radiation source PRS, and broaden it to provide output radiation ORD. The working medium WM enables the broadening of the frequency range of the received input radiation IRD so as to provide broadened output radiation ORD.

The radiation source RDS further comprises a reservoir RSV. The optical fiber OF is disposed inside the reservoir RSV. The reservoir RSV may also be referred to as a housing, container or gas cell. The reservoir RSV is configured to contain the working medium WM. The reservoir RSV may comprise one or more features, known in the art, for controlling, regulating, and/or monitoring the composition of the working medium WM (which may be a gas) inside the reservoir RSV. The reservoir RSV may comprise a first transparent window TW1. In use, the optical fiber OF is disposed inside the reservoir RSV such that the first transparent window TW1 is located proximate to an input end IE of the optical fiber OF. The first transparent window TW1 may form part of a wall of the reservoir RSV. The first transparent window TW1 may be transparent for at least the received one or more input radiation frequencies, so that received input radiation IRD (or at least a large portion thereof) may be coupled into the optical fiber OF located inside reservoir RSV. It will be appreciated that optics (not shown) may be provided for coupling the input radiation IRD into the optical fiber OF.

The reservoir RSV comprises a second transparent window TW2, forming part of a wall of the reservoir RSV. In use, when the optical fiber OF is disposed inside the reservoir RSV, the second transparent window TW2 is located proximate to an output end OE of the optical fiber OF. The second transparent window TW2 may be transparent for at least the frequencies of the broadened output radiation ORD of the apparatus.

Alternatively, in another embodiment, the two opposed ends of the optical fiber OF may be placed inside different reservoirs. The optical fiber OF may comprise a first end section configured to receive input radiation IRD, and a second end section for outputting broadband output radiation ORD. The first end section may be placed inside a first reservoir, comprising a working medium WM. The second end section may be placed inside a second reservoir, wherein the second reservoir may also comprise a working medium WM. The functioning of the reservoirs may be as described in relation to FIG. 4B above. The first reservoir may comprise a first transparent window, configured to be transparent for input radiation IRD. The second reservoir may comprise a second transparent window configured to be transparent for broadband output broadband radiation ORD. The first and second reservoirs may also comprise a sealable opening to permit the optical fiber OF to be placed partially inside and partially outside the reservoir, so that a gas can be sealed inside the reservoir. The optical fiber OF may further comprise a middle section not contained inside a reservoir. Such an arrangement using two separate gas reservoirs may be particularly convenient for embodiments wherein the optical fiber OF is relatively long (for example when the length is more than 1 m). It will be appreciated that for such arrangements which use two separate gas reservoirs, the two reservoirs (which may comprise one or more features, known in the art, for controlling, regulating, and/or monitoring the composition of a gas inside the two reservoirs) may be considered to provide an apparatus for providing the working medium WM within the hollow core HC of the optical fiber OF.

In this context a window may be transparent for a frequency if at least 50%, 75%, 85%, 90%, 95%, or 99% of incident radiation of that frequency on the window is transmitted through the window.

Both the first TW1 and the second TW2 transparent windows may form an gastight seal within the walls of the reservoir RSV so that the working medium WM (which may be a gas) may be contained within the reservoir RSV. It will be appreciated that the gas WM may be contained within the reservoir RSV at a pressure different to the ambient pressure of the reservoir RSV.

The working medium WM may comprise a noble gas such as argon, krypton, xenon, a Raman active gas such as hydrogen, deuterium and/or nitrogen, or a gas mixture such as an argon/hydrogen mixture, a xenon/deuterium mixture, a krypton/nitrogen mixture, krypton/helium, or a nitrogen/hydrogen mixture. Depending on the type of filling gas, the nonlinear optical processes can include modulational instability (MI), soliton self-compression, soliton fission, Kerr effect, Raman effect and/or dispersive wave generation, details of which are described in PCT patent application publication no. WO2018/127266A1 and U.S. Pat. No. 9,160,137, both of which are hereby incorporated in their entireties by reference. Since the dispersion of the filling gas can be tuned by varying the working medium WM pressure in the reservoir RSV (i.e. gas cell pressure), the generated broadened pulse dynamics and the associated spectral broadening characteristics can be adjusted so as to optimize the frequency conversion.

In one implementation, the working medium WM may be disposed within the hollow core HC at least during receipt of input radiation IRD for producing broadband output radiation ORD. It will be appreciated that, while the optical fiber OF is not receiving input radiation IRD for producing broadband output radiation, the gas WM may be wholly or partially absent from the hollow core HC.

In order to achieve frequency broadening, high intensity radiation may be desirable. An advantage of having a hollow core optical fiber OF is that it may achieve high intensity radiation through strong spatial confinement of radiation propagating through the optical fiber OF, achieving high localized radiation intensities. The radiation intensity inside the optical fiber OF may be high, for example due to high received input radiation intensity and/or due to strong spatial confinement of the radiation inside the optical fiber OF. An advantage of hollow core optical fibers is that they can guide radiation having a broader wavelength range that solid-core fibers and, in particular, hollow core optical fibers can guide radiation in both the ultraviolet and infrared ranges.

An advantage of using a hollow core optical fiber OF may be that the majority of the radiation guided inside the optical fiber OF is confined to the hollow core HC. Therefore, the majority of the interaction of the radiation inside the optical fiber OF is with the working medium WM, which is provided inside the hollow core HC of the optical fiber OF. As a result, the broadening effects of the working medium WM on the radiation may be increased.

The received input radiation IRD may be electromagnetic radiation. The input radiation IRD may be received as pulsed radiation. For example, the input radiation IRD may comprise ultrafast pulses, for example, generated by a laser.

The input radiation IRD may be coherent radiation. The input radiation IRD may be collimated radiation, an advantage of which may be to facilitate and improve the efficiency of coupling the input radiation IRD into the optical fiber OF. The input radiation IRD may comprise a single frequency, or a narrow range of frequencies. The input radiation IRD may be generated by a laser. Similarly, the output radiation ORD may be collimated and/or may be coherent.

The broadened range of the output radiation ORD may be a continuous range, comprising a continuous range of radiation frequencies. The output radiation ORD may comprise supercontinuum radiation. Continuous radiation may be beneficial for use in a number of applications, for example in metrology applications. For example, the continuous range of frequencies may be used to interrogate a large number of properties. The continuous range of frequencies may for example be used to determine and/or eliminate a frequency dependency of a measured property. Supercontinuum output radiation ORD may comprise for example electromagnetic radiation over a wavelength range of 100 nm-4000 nm, or even up to 10 µm. A broadband output radiation ORD frequency range may be for example 400 nm-900 nm, 500 nm-900 nm, or 200 nm-2000 nm or any range selected within 200 nm-2000 nm. The supercontinuum output radiation ORD may comprise white light.

The input radiation IRD provided by the pulsed pump radiation source PRS may be pulsed. The input radiation IRD may comprise electromagnetic radiation of one or more frequencies between 200 nm and 2 µm. The input radiation IRD may for example comprise electromagnetic radiation with a wavelength of 1.03 µm. The repetition rate of the pulsed radiation IRD may be of an order of magnitude of 1 kHz to 100 MHz. The pulse energies may have an order of magnitude of 0.1 µJ to 100 µJ, for example 1-10 µJ. A pulse duration for the input radiation IRD may be between 10 fs and 10 ps, for example 300 fs. The average power of input radiation IRD may be between 100 mW to several 100 W. The average power of input radiation IRD may for example be 20-50 W.

The pulsed pump radiation source PRS may be a laser. One or more spatio-temporal transmission characteristics of such a laser pulse, e.g. its spectral amplitude and phase, transmitted along the optical fiber OF can be varied and tuned through adjustment of one or more (pump) laser parameters, one or more working medium WM variations, and/or one or more optical fiber OF parameters. The one or more spatio-temporal transmission characteristics may include one or more selected from: output power, output mode profile, output temporal profile, width of the output temporal profile (or output pulse width), output spectral profile, and/or bandwidth of the output spectral profile (or output spectral bandwidth). The one or more pulse pump radiation source PRS parameters may include one or more selected from: pump wavelength, pump pulse energy, pump pulse width, and/or pump pulse repetition rate. The one or more optical fiber OF parameters may include one or more selected from: optical fiber length, size and/or shape of the hollow core, size and/or shape of the capillaries, and/or thickness of the walls of the capillaries surrounding the hollow core. The one or more working medium WM, e.g. filling gas, parameters may include one or more selected from: gas type, gas pressure and/or gas temperature.

The broadened output radiation ORD provided by the radiation source RDS may have an average output power of at least 1 W. The average output power may be at least 5 W. The average output power may be at least 10 W. The broadened output radiation ORD may be pulsed broadened output radiation ORD. The broadened output radiation ORD may have a power spectral density in the entire wavelength band of the output radiation of at least 0.01 mW/nm. The power spectral density in the entire wavelength band of the broadened output radiation may be at least 3 mW/nm.

FIG. 5 shows an example of a radiation source apparatus comprising a HC-PCF. The radiation source 500 may comprise a gas cell 502 with an HC-PCF 501 therein. Each of the two ends of the HC-PCF 501 may be optically coupled to a window 503/504, through which the input and output beams travel.

In use, the gas cell 502 may be filled with a gas (which may be a gas mix) and the HC-PCF 501 may be filled with the same or substantially similar gas. A gas flow may be established by providing a pressure difference between the input and output ends of the HC-PCF 501. Such a pressure in the gas cell or/and in the HC-PCF 501 may be the range 0.1-100 bar. The gas cell may be composite.

Input radiation, such as pump laser radiation, enters the radiation source through input window 503. The beam of input radiation 506 is converged and enters the HC-PCF 501. The spectrum of the beam is broadened as it travels through the HC-PCF 501, yielding a broadened output beam 505.

A gap 509 is provided between the end facets of the HC-PCF and the windows to prevent dielectric breakdown of the windows, especially the output window. As shown in FIG. 5, broadened beam segment 505 diverges as it exits the HC-PCF output facet, such that the intensity of the beam once it reaches output window 503 is lower. Accordingly, the intensity of the beam impinging on the output window 503 is lower than the intensity threshold for dielectric breakdown of the window.

When operating a HC-PCF based radiation source, such as the radiation source 500, contaminants grow on the end facets of the HC-PCF over time. In particular, it has been observed that contamination growths develop predominantly on the output facet of a HC-PCF. The growth of contamination appears to occur where the intensity of the radiation is highest, in particular, contamination growth is higher at the output facet of the HC-PCF than at the output window. Growth of contamination also appears to occur where the radiation has been spectrally broadened, in particular, contaminations do not grow as strongly on the input facet. In addition, contaminations are predominantly observed on the output facet of the of the HC-PCF, and not inside the HC-PCF itself.

The contaminants may develop due to silica particles being ablated from the windows of the gas cell, or from the HC-PCF. Contaminants may undergo a photo-induced process with the broadened output radiation from the HC-PCF and change their chemical structure and/or crystallize on the output facet. After a certain amount of hours in operation (e.g., after a certain dose (J) of laser energy has been transmitted), this contamination results in the fiber's performance being degraded; this degradation may be referred to as the glassy growth phenomenon (GGP): e.g., $SiO_x$ structures growing at the output end of the fiber.

Alternatively, GGP may relate to mobilization of silicon (as atoms, or volatile species, such as $SiH_4$) via physical or chemical sputtering and/or to plasma-induced or temperature-induced deposition at the output end of the fiber (for example via dissociation of $SiH_4$ into Si (solid)+2 $H_2$ or via plasma-induced polymerization).

The buildup of these contaminants results in a decreased lifetime of the radiation source. GGP and the resultant contamination growths at the output facet can protrude into the optical path of the diverging beam. This causes scattering of the output radiation and thus leads to the decay of output power of the radiation source. GGP shortens the lifetime of the source: GGP causes radiation scattering and therefore the fiber loses its performance. This may result, for example, in the required photon budget for the sensor not being met after approximately 200 hours. Also, GGP causes drift of the radiation source power/spectral density and mode profile which, if unresolved, will require frequent re-calibrations. As such, the short lifetime of the fiber means frequent fiber swaps in the field, and might cause a very significant downtime (on the order of days) for the machine per year. This is not acceptable for an industrialized product.

To reduce these contamination growths and prolong the operational lifetime of an HC-PCF radiation source, it may be desirable, for example, to prevent formation of contaminants, reduce their concentration in the radiation source apparatus, and/or or to suppress contaminant-induced GGP growth. Possible techniques for reducing the concentration of contaminants and preventing their formation include rigorous cleaning of the gas environment and parts of the radiation generating cell/bulb prior to use in the radiation source. However, it is challenging to achieve sufficient cleaning with known cleaning methods, and not all contaminants can be avoided.

FIG. 6A shows results of the average output power of an HC-PCF over total operational time. After about 180 hours, the average output power of the HC-PCF begins to decay from over 7.50 watts to under 7.00 watts.

FIG. 6B shows a schematic example of a contamination growth at the output end facet of a HC-PCF after an extended period of operation.

The exact source of the contaminants is not known, however it is believed that contaminants may arise from organic materials in the gas cell environment, such as from remaining residuals of the fiber polymer coating, from lubricants of the pneumatic components, from the gas cell fabrication process, or from the working gas used in the gas cell. In particular, the following GGP mechanism is postulated:

1) Laser and/or radiation induced breakdown takes place at the fiber's end:
   UV and visible components (at least) are absorbed strongly (single or multiphoton absorption) and cause ionization of the gas within every pulse. This explains the absence of GGP at the input of the fiber, where, e.g., only IR laser radiation is incident, and the presence of GGP at the output of the fiber;
   Unconstrained plasma (fed by high frequency radiation pulses) reaches steady state at some distance from the fiber's end (here, concentration of ions and electrons is significantly higher than within the fiber, due to lack of recombination by or at the walls);
   Ions/electrons (with relatively high concentration) from the unconstrained plasma boost radiation absorption and propagate the plasma towards and possibly into the fiber ballistically via ambipolar diffusion; plasma exponentially decays as it enters the narrow channel of the fiber with a factor about $\exp(-x/d)$, where x is the distance measured from the fiber end and d is inner diameter. This allows for plasma propagation up to a few (core) widths into the fiber.

2) Fiber material ($SiO_2$ mostly) is subject to such plasma, and is sputtered and redeposited:
   Surface atoms may be physically sputtered due to presence of high atomic mass ions of noble gas (it has been observed that GGP tends to occur only in fibers filled with noble gas);
   Surface atoms may be chemically sputtered due to presence of active forms of hydrogen (radicals and ions) in the reactions, such as: $SiO_2 + (H^+, H^*, H_3^+) \Longrightarrow SiH_4(g) + H_2O(g)$;
   The Si atoms are re-deposited (and, possibly re-oxidized immediately) in the high electric field regions (such as the fiber's end, where dielectric constant is discontinuous for the propagating radiation);

The sharp peaks of the growing structures act as field/temperature concentrators and may further promote the deposition.

Alternatively or additionally, $SiH_4$ is decomposed in the high temperature (or high radical/ion concentration) of the unconstrained plasma, thus Si is re-deposited at the fiber's end;

Alternatively or additionally, $SiH_4$ may be prone to plasma induced polymerization (at the fiber end) with deposition of branched, heavy molecules or radicals $Si_xH_y$ or $Si_xH_yO_z$, $x \gg 1$, $y \gg 1$ Some oxidation of fluffy Si structures may occur when the fiber is exposed to air, prior to inspection.

FIG. 6C illustrates this laser and/or radiation induced breakdown scheme. A fiber or HC-PCF 100 comprises an input end 101 and output end 102. Laser pulses 110 are coupled into the HC-PCF 100 and converted to co-propagating wide-band pulses 121 and reduced energy laser pulses 120. Plasma 200 is ignited by absorption of UV/visible components of the radiation in a steady state region 201 of the plasma. Within the numerical aperture (NA) 130 of the radiation source, a portion 202 of the plasma propagates upstream of the radiation beam and partially enters the output end of the fiber 102. The plasma is maintained by regular radiation pulses.

As such, the output end of the fiber 102 is subject to plasma 202 which induces etching and/or deposition. This results in volatile molecules ($SiH_4$) or sputtered atoms (Si) being produced from the end facet of fiber and/or from the channel of the fiber (e.g., up to few diameters deep). Consequently, GGP structures grow by (temperature and/or plasma-induced) decomposition/oxidation of $SiH_4$ or by direct deposition of (previously sputtered) Si atoms. It has been observed that formation of these GGP structures exponentially decays with depth within the fiber, such that they virtually disappear at the depth $L_s \sim (0.2 \ldots 2)*D_f$, where $D_f$ is the fiber channel internal diameter.

To reduce the contamination growths on the end facets of the HC-PCF, the capillaries of the HC-PCF may be collapsed. Tapered ends of capillaries may prevent the contamination growths from occurring. However, this solution does not address the underlying problem of contaminants in the apparatus, and contamination growth cannot be fully avoided, particularly if the taper in the capillaries is not perfect.

Another problem in HC-PCF/gas cell radiation sources is turbulent gas flow in the gas cell. HC-PCF/gas cell radiation source designs can operate at dimensions and pressures which yield a Reynolds number of $Re > 10^7$, meaning the system is highly prone to turbulent flow. Turbulences can introduce density inhomogeneities in the gas which result in dynamic changes in the optical path length of the input or output beam. This may cause the output radiation to flicker. This variability in the radiation source makes it unreliable, in particular for metrology applications where a consistent radiation output from a source is desired.

In particular, turbulent gas flows in the gaps between the HC-PCF end facets and the windows to which they are coupled may also cause additional problems. A more turbulent flow increases the rate at which gas traverses the path of the input/output beams 505/506, and also increases the rate at which the gas in the input/output beams 505/506 is exchanged with the rest of the gas in the gas cell. Therefore, in the case that contamination growths are caused by some photo-induced process, a more turbulent flow will increase the rate at which contaminating particles cross the path of a beam, and thus increase the rate at which contaminants are able to crystallize or otherwise accumulate in the apparatus.

Accordingly, there is provided an apparatus to prevent or delay the rate of contamination growth on an HC-PCF in a radiation source. The present disclosure provides a surface for minimizing the gas volume that comes into contact with the beam of the radiation source while it is operating.

In view of the above problems in HC-PCF radiation sources, the surface may perform any combination of the following structural roles: to minimize a first gas volume between a facet end of a HC-PCF and the window to which it is optically coupled; to restrict the rate of gas exchange between this first volume and the remainder of the gas cell; and/or to reduce turbulence in this first volume, or in the gas cell generally.

The radiation source of an embodiment may comprise a gas cell having a window; an optical fiber that is hollow and having an axial direction, an end thereof being enclosed within the gas cell and optically coupled to the window via an optical path; and a surface, disposed around the end of the optical fiber, and extending past the end of the optical fiber in the axial direction towards the window so as to limit the exchange of gas between the optical path and the remainder of the gas cell.

The gas cell may have a window on one of its axial ends. The gas cell may comprise two windows, each disposed on an axial end. The walls of the gas cell may comprise metal.

The optical fiber may be an HC-PCF. Only the output end of the optical fiber may be contained within the gas cell. Alternatively, the entirety of the optical fiber may be contained within the gas cell. The optical fiber may comprise a second end, the second end also being optically coupled to a second window of the gas cell.

In an embodiment, the surface is provided by the inner surface of the gas cell. The surface may be provided by at least one wall of the gas cell. The thickness of the at least one gas cell wall may vary in the axial direction.

In an embodiment, the surface is provided by a protective element or shield. In other words, the shield is an embodiment of the surface which minimizes the gas volume that comes into contact with the beam of the radiation source while it is operating. The shield may be materially separate from the gas cell and/or be manufactured separately from the gas cell. The shield may be affixed to the interior of the gas cell.

The surface may extend along the optical fiber for a given length, wherein the surface is offset from the periphery (e.g., circumference) of the optical fiber forming a gap.

This gap between the optical fiber and the surface may be considered a "radial gap" (although the fiber need not have a circular cross-section). The radial gap may be rotationally symmetric with respect to the axial direction. The radial gap may be shaped as a cylindrical shell. The radial gap may have a non-uniform shape. The radial gap may be the primary route through which gas can flow to the optical path from the remainder of the gas cell. The radial gap may be one of multiple gaps allowing gas flow to the optical path. The size of the radial gap may be configured to achieve a certain rate of gas exchange therethrough. The size of the radial gap may limit gas exchange therethrough to no more than $10^{-1}$ mol/hour, no more than $10^{-4}$ mol/hour, no more than $10^{-7}$ mol/hour, or no more than $10^{-10}$ mol/hour.

The radiation source may have a gap between the optical fiber and the surface that has a minimum cross-sectional area normal to the axial direction between 100 $\mu m^2$ and 3 $mm^2$.

In other words, the surface may not completely conform to the outer surface of the optical fiber.

The portion of the surface surrounding the optical fiber may not contact the fiber at any point. Alternatively, the portion of the surface surrounding the optical fiber may contact the fiber at one or more points. Support members may be formed from the surface and be configured to support or mount the optical fiber in a particular position. Support members for the optical fiber may be provided by a structure other than the surface.

The surface may abut or be sealed to the optical fiber.

The surface may be sealed to the optical fiber with soldering, welding or a low outgassing glue.

The end of the surface provided by the shield may abut or be sealed with the window, or the gas cell surface containing the window.

The surface may comprise silica. The surface may comprise a silica coating on the inner surface of the gas cell. The shield may comprise silica. The end of the surface provided by a shield may be sealed to the window with glass-to-glass soldering or laser welding. An end of the surface provided by a shield may be sealed to the gas cell using laser welding. The shield and the window or gas cell to which it is sealed may be manufactured as a single piece, or be otherwise integrally formed. The single-piece shield and window or gas cell may be manufactured using subtractive manufacturing, optionally selective laser etching. The single-piece shield and window or gas cell may comprise silica.

The end of the surface and the window or gas cell inner surface may be separated by a small gap. This gap between the end of the surface and optionally shield and the window or gas cell inner surface may be considered an "axial gap". The axial gap may be the primary route through which gas can flow to the optical path from the remainder of the gas cell. The axial gap may be one of multiple gaps allowing gas flow to the optical path. The size of the gap may be configured to achieve a certain rate of gas exchange therethrough. The size of the axial gap may limit gas exchange therethrough to no more than $10^{-1}$ mol/hour, no more than $10^{-4}$ mol/hour, no more than $10^{-7}$ mol/hour, or no more than $10^{-10}$ mol/hour.

The radiation source may comprise a surface disposed on the output end of the optical fiber. The radiation source may comprise a shield disposed on the output end of the optical fiber.

The radiation source may comprise a surface disposed on the input end of the optical fiber. The radiation source may comprise surfaces disposed on each of the input and output end of the optical fiber. These surfaces may form one continuous surface. These surfaces may be separated by a surface discontinuity, or be otherwise materially separate. These surfaces may each be provided by a shield.

The member which provides the surface, e.g. the shield, may comprise silica, a metal, silicon, or other semiconductor. A coating on the inner surface of the gas cell forming the surface may comprise silica, a metal, silicon, or other semiconductor. The shield may comprise silica, a metal, silicon, or other semiconductor. Such a surface may comprise a non-etchable material (e.g., robust to H* or H+), such as metal, metal oxide, noble metal (as a coating or as bulk), and/or a ceramic, possibly with low or zero content of C and Si.

The surface, gas cell wall, and/or shield of the radiation source may comprise a mixture of materials.

The gas cell of the radiation source may have a non-constant wall thickness. The shield of the radiation source may have a non-constant wall thickness.

The wall of the gas cell or shield may be thicker at the axial end surrounding the optical fiber. The wall of the gas cell or shield may be thicker at points to alter the gas flow in the remainder of the gas cell. The wall of the gas cell or shield may be thicker where support members are provided by the surface to hold the optical fiber. The wall of the shield may be thicker where external support members are provided by the outer surface of the shield to structurally support the shield within the gas cell. One or more external support members may be provided by parts separate from the shield, to hold or position the shield in the gas cell.

The radiation source may comprise a surface that is rotationally symmetric with respect to the axial direction.

The surface may define one of the following shapes: a cylinder, a frustro-cone or a horn.

The outer surface of the shield may define one of the following shapes: a cylinder, a frustro-cone or a horn.

The inner surface of the shield may define one of the following shapes: a cylinder, a frustro-cone or a horn.

In an embodiment, the surface may not be rotationally symmetric. The surface, and optionally the outer and/or inner surface of the shield, may describe non-rotationally symmetric shapes. The surface may comprise one or more support members to mount or otherwise support the optical fiber in a particular position within the gas cell. Optionally, the shield may comprise one or more support members on its inner or outer surface to mount or otherwise support the optical fiber or shield in a particular position within the gas cell. The surface, optionally the inner and/or outer surface of the shield, may comprise structural features to redirect gas flow, reduce turbulence and/or redirect turbulent flows away from the optical path. These structures may comprise structured/textured surfaces, fins or flow straighteners.

Structures other than the surface and shield may be provided to reduce or redirect turbulent flow in the gas cell. These structures may comprise structured/textured surfaces, fins or flow straighteners.

The surface (e.g. the shield of the radiation source) may have a non-constant width (e.g., diameter) normal to the axial direction. In other words, the surface may define a width normal to the axial direction, and the width varies in the axial direction.

The width (e.g., diameter) of the surface (e.g. shield) may be larger at the end thereof adjacent the window. In other words, the cross section of the surface normal to the axial direction may be larger at the end adjacent the window, than at the cross section of the surface at the end surrounding the optical fiber.

The inner width (e.g., diameter) of the surface (e.g. shield) may gradually increase from a first smaller width surrounding the end of the optical fiber, to a larger width adjacent the window.

The inner diameter of the surface (e.g. shield) may be larger than the minimum diameter provided by the following equation:

$$D_{min} = w_0 \sqrt{1+(z/z_R)^2} \qquad (1)$$

where $w_0$ is the mode field diameter at the end of the optical fiber, z is the distance from the end of the optical fiber, and $z_R$ is the Rayleigh length.

The inner diameter of the surface (e.g. shield) may be the diameter provided by equation (1). In other words, the inner diameter of the shield may be substantially equal to the minimum diameter provided by equation (1).

Equation (1) is derived from the expected local beam diameter at a given distance from the output end of the optical fiber. Other equations estimating this beam diameter/ width may be used to dimension the surface. It may be generally desirable for the surface to closely follow but not obstruct the output beam of the optical fiber. These principles for the dimensions of the surface may also be applied to the input end of the optical fiber. The portion of the surface disposed around the input end of the optical fiber may closely follow but not obstruct the input beam received by the input end of the optical fiber.

The shield of the radiation source may have a constant cross section normal to the axial direction. In other words, the shield may have the shape of a prism. The shield may have the shape of a cylindrical shell, or other prism defining a hollow interior space.

The gas cell of the radiation source may comprise at least one gas selected from: helium, neon, argon, krypton, xenon, hydrogen, oxygen, nitrogen, other molecular gases and/or mixtures thereof.

The radiation source may be coupled to an optical source, the optical source comprising a pump laser. The optical source may be coupled to the input end of the HC-PCF through a window.

A metrology apparatus of an embodiment comprises a radiation source according to an embodiment of the present disclosure, wherein the radiation source is configured to generate radiation for projection onto a substrate.

The metrology device may be a scatterometer.

The metrology device may be used in metrology applications such as overlay, alignment and/or leveling.

Figure 7:
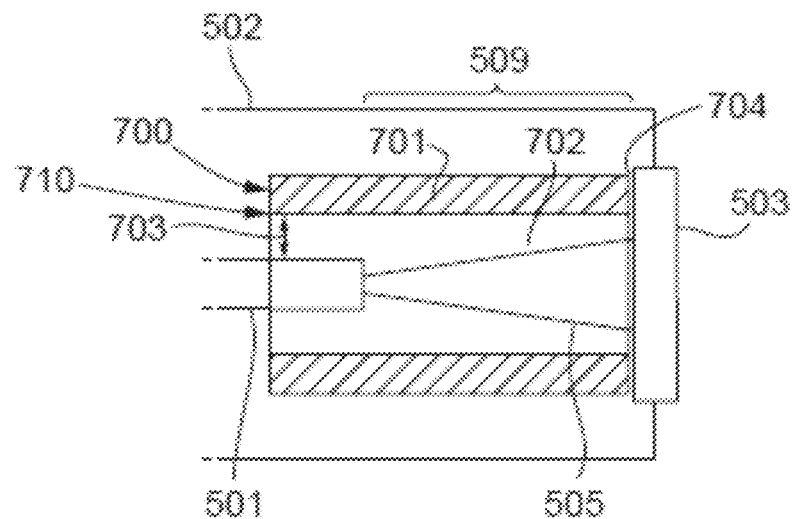
FIG. 7 depicts an embodiment of a radiation source.

FIG. 7 shows a configuration of an embodiment of a radiation source. The radiation source comprises a gas cell 502 having a window 503, an optical fiber 501 optically coupled to the window 503 across a gap 509, and a protective element or shield 700 providing surface 710. Output beam 505 is shown exiting the end of the optical fiber 501 and diverging as it travels to the window 503. The shield 700 is disposed around the end of the optical fiber 501, and extends in both axial directions, parallel to the optical fiber axis.

The shield in FIG. 7 has the shape of a cylindrical shell. A cross-section of the shield is shown taken along the axial direction, showing the wall material 701 and an inner void 702 of the shield. The end of the optical fiber is enclosed within the shield.

Shield 700 in FIG. 7 is rotationally symmetric with respect to the axial direction of the optical fiber 501. The inner surface 710 of shield 700 has a constant inner diameter throughout. At the fiber-end of the shield, there is a radial gap 703 between the end of the optical fiber and the inner surface 710 of the shield 700. At the window-end of the shield, the inner diameter of the shield surface 710 is greater than the maximum width of output beam 505. A small axial gap 704 exists between the end of the shield 700 and the window 503.

The shield 700 restricts the local gas volume surrounding the optical path of the output beam 505. The shield 700 also axially restricts the gas flow through the apparatus, and substantially restricts radial flow from the remainder of the gas cell from reaching the optical path. In the embodiment shown, gas flows may only access the optical path through radial gap 703 and axial gap 704. The rate of contaminants crossing the optical path should therefore be reduced, relative to if the shield was not there at all.

The gaps 703 and 704 of the shield 700 allow for the gas in the optical path of the output beam 505 to fluidly communicate with the remainder of the gas cell, while restricting gas flows from crossing through the optical path. It is still desirable for gas to reach the optical path, as the generation of the broadened output by the radiation source is dependent on gas pressure.

As shown in FIG. 7, radial gap 703 may be formed between the outer surface of the optical fiber, and the inner surface 710 of the shield 700. The length of this gap in the axial direction may be configured to limit gas exchange to a chosen maximum rate. The cross-sectional size of the gap in the radial direction may also be configured to limit gas exchange to a chosen maximum rate.

The dimensions of the axial gap 704 between the end of the shield and the window may also be configured to limit gas exchange at this location to a chosen maximum rate.

The dimensions of the radial gap 703 and/or the axial gap 704 may be configured to reduce turbulent flow into the optical path region. It may not be feasible to achieve laminar flow at particular apparatus dimensions/pressures, but a reduction in turbulent character of the gas flow is still preferable.

The dimensions of radial gap 703 and axial gap 704 may be configured to achieve a particular gas flow effect due to their combined use. The gaps may be configured to have similar inflow/outflow rates, or to direct flow towards each other to prevent gas flows from crossing the optical path.

Alternatively, in this embodiment, the axial gap 704 may not exist, and the end of the shield may abut or be sealed to the output window. Alternatively, in this embodiment, the radial gap 703 may not exist, and the shield may abut or be sealed to the fiber.

In other embodiments, the shape or dimensions of a radial gap and an axial gap may be configured, in isolation or in combination, to yield one or more other desired gas flow properties. One or more desired gas flow properties may include a particular flow topology which prevents excessive turbulence from developing in or around the optical path.

Figure 8:
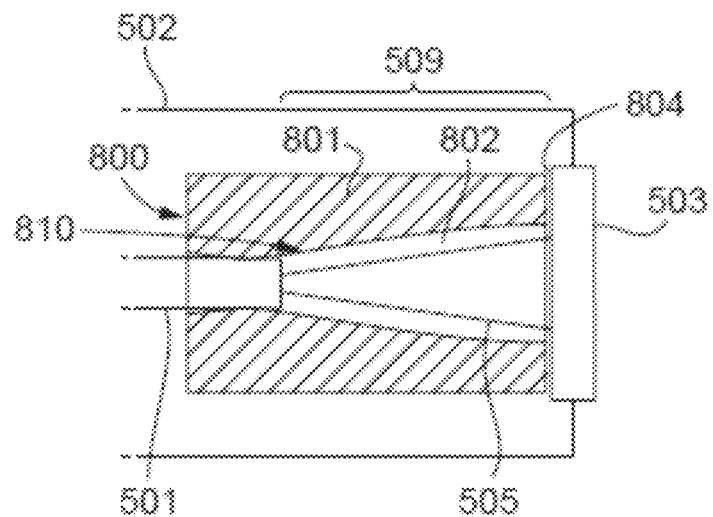
FIG. 8 depicts an embodiment of a radiation source.

FIG. 8 shows a configuration of a further embodiment of the radiation source. The embodiment of FIG. 8 comprises the same components as in FIG. 7 aside from the shield 800 with surface 810. The radiation source comprises a gas cell 502 having a window 503, an optical fiber 501 optically coupled to the window 503 across a gap 509, and a protective element or shield 800. Output beam 505 is shown exiting the end of the optical fiber 501 and diverging as it travels to the window 503. The surface 810 of shield 800 is disposed around the end of the optical fiber 501, and extends in both axial directions, parallel to the optical fiber axis.

Shield 800 differs from shield 700 in that surface 810 abuts the end of the optical fiber 501, forming a seal around the entire outer periphery of the optical fiber 501. Consequently, in the embodiment shown in FIG. 8, there is no gap between the surface 810 and the optical fiber 501 corresponding to the radial gap 703 of FIG. 7. There is however an axial gap 804 in this embodiment such that the gas in the optical path can fluidly communicate with the gas in the remainder of the gas cell 502. Any of the optional features disclosed for axial gap 704 may equally apply to axial gap 804.

Shield 800 is rotationally symmetric with respect to the axial direction of the optical fiber 501, and a cross section of the shield 800 has been taken along the axial direction, showing the wall material 801 and the inner void 802.

Shield 800 also differs from shield 700 in that surface 810 has a width that varies with respect to the axial direction. The surface 810 describes a generally frustro-conical shape, with the larger end of the frustro-cone at the end of the shield adjacent the window 503.

The cross-section of the surface 810 of the shield, shown in FIG. 8 by the boundary between the wall material 801 and the inner void 802, follows the shape of the output beam 505. Therefore in this embodiment, the gas volume surrounding the optical path is more limited than in FIG. 7. Reducing the gas volume surrounding the optical path in this manner may reduce the rate at which contaminants in the gas can cross the optical path and therefore accumulate.

The shield 800 and surface 810 do not intersect with, or otherwise obstruct the output beam 505, as this will affect the characteristics of the radiation output by the radiation source. It may be appropriate to implement a minimum spatial tolerance between the beam width (e.g., diameter) and the inner width (e.g., diameter) of the inner surface of the shield, indicated in FIG. 8 by the gap between the output beam 505 and the surface 810.

The shield 800 also restricts the extent to which turbulent gas flows from the remainder of the gas cell can access the optical path. As the optical fiber 501 forms a closed portion with the shield 800, the only route through which gas in the gas cell can fluidly communicate with the optical path is through gap 804. While this flow path is radial with respect to the optical path, the dimensions of gap 804 can be configured to limit the rate of flow, or the turbulent character of the flow, entering the optical path.

While the shields 700 and 800 of the above embodiments have been disclosed separately, it may be desirable to combine features from both embodiments. For example, it may be desirable to have a shield with an axial gap 703 as in shield 700, in combination with a frustro-conical inner surface as in shield 800. The separate disclosure of embodiments herein is not intended to limit possible feature combinations of different embodiments herein for the radiation source of the present disclosure of this document.

Figure 9:
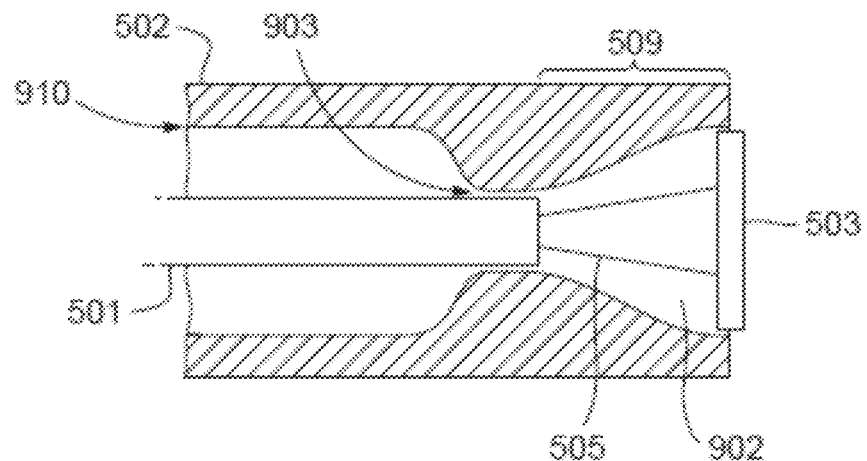
FIG. 9 depicts an embodiment of a radiation source.

FIG. 9 shows a configuration of a further embodiment of the radiation source. The embodiment of FIG. 9 comprises a surface 910 that is provided by the inner surface of the gas cell, instead of by a shield. The radiation source also comprises a gas cell 502, having a window 503, an optical fiber 501 optically coupled to the window 503 across gap 509, and surface 910.

The surface 910 is formed by constriction or taper of the inner surface of the gas cell 502 near the end of the optical fiber. The gas cell 502 therefore has a variable wall thickness in the axial direction. The narrowest point in this constriction or tapered portion forms the radial gap 903 between the surface and the optical fiber. The surface 910 tapers outwards from radial gap 903 to the window 503, to provide space for the optical path 505. The surface 910 therefore restricts the local gas volume surrounding the optical path of the output beam 505, and restricts flow from the remainder of the gas cell from reaching the optical path through radial gap 903. In the embodiment shown, gas flows may only access the optical path through radial gap 903. The rate of contaminants crossing the optical path should therefore be reduced, relative to if the constricted or tapered portion of surface 910 was not so configured.

The cross-sectional size of the radial gap 903 may also be configured to limit gas exchange to a chosen maximum rate.

The dimensions of the radial gap 903 may be configured to reduce turbulent flow into the optical path region. It may not be feasible to achieve laminar flow at particular apparatus dimensions/pressures, but a reduction in turbulent character of the gas flow is still preferable.

Alternatively, in this embodiment the radial gap 903 may not exist, and the surface 910 may abut or be sealed to the optical fiber 501, optionally around the end of the optical fiber 501. In other words, the inner surface of the gas cell 502 may abut or be sealed to parts of the optical fiber 501.

Figure 10:
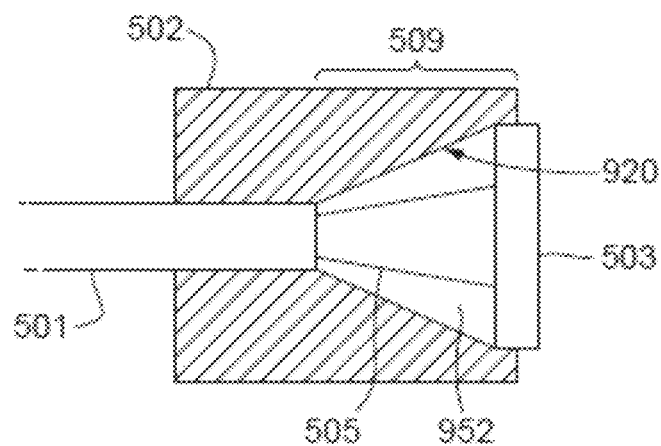
FIG. 10 depicts an embodiment of a radiation source.

FIG. 10 shows a configuration of a further embodiment of the radiation source. The embodiment of FIG. 10, like FIG. 9 comprises a surface 920 that is provided by the inner surface of the gas cell, instead of by a shield. The radiation source also comprises a gas cell 502, having a window 503, an optical fiber 501 optically coupled to the window 503 across gap 509, and surface 920.

In this embodiment of the radiation source, the gas cell 502 is shown to only encapsulate the end of the optical fiber. In other words, the middle portion of the optical fiber 501 is not embedded in the gas cell 502.

The surface 920 abuts/is sealed to the end of optical fiber 510, forming a seal around the entire outer periphery of the optical fiber 501. The surface 920 tapers outwards from the seal to the window 503, to provide space for the optical path 505. The gas cell 502 therefore has a variable wall thickness in the axial direction to provide surface 920. The surface 920 restricts the local gas volume surrounding the optical path of the output beam 505. As with the previous embodiments in FIGS. 7 to 9, reducing the gas volume surrounding the optical path in this manner may reduce the rate at which contaminants in the gas can cross the optical path and therefore accumulate.

Figure 11:
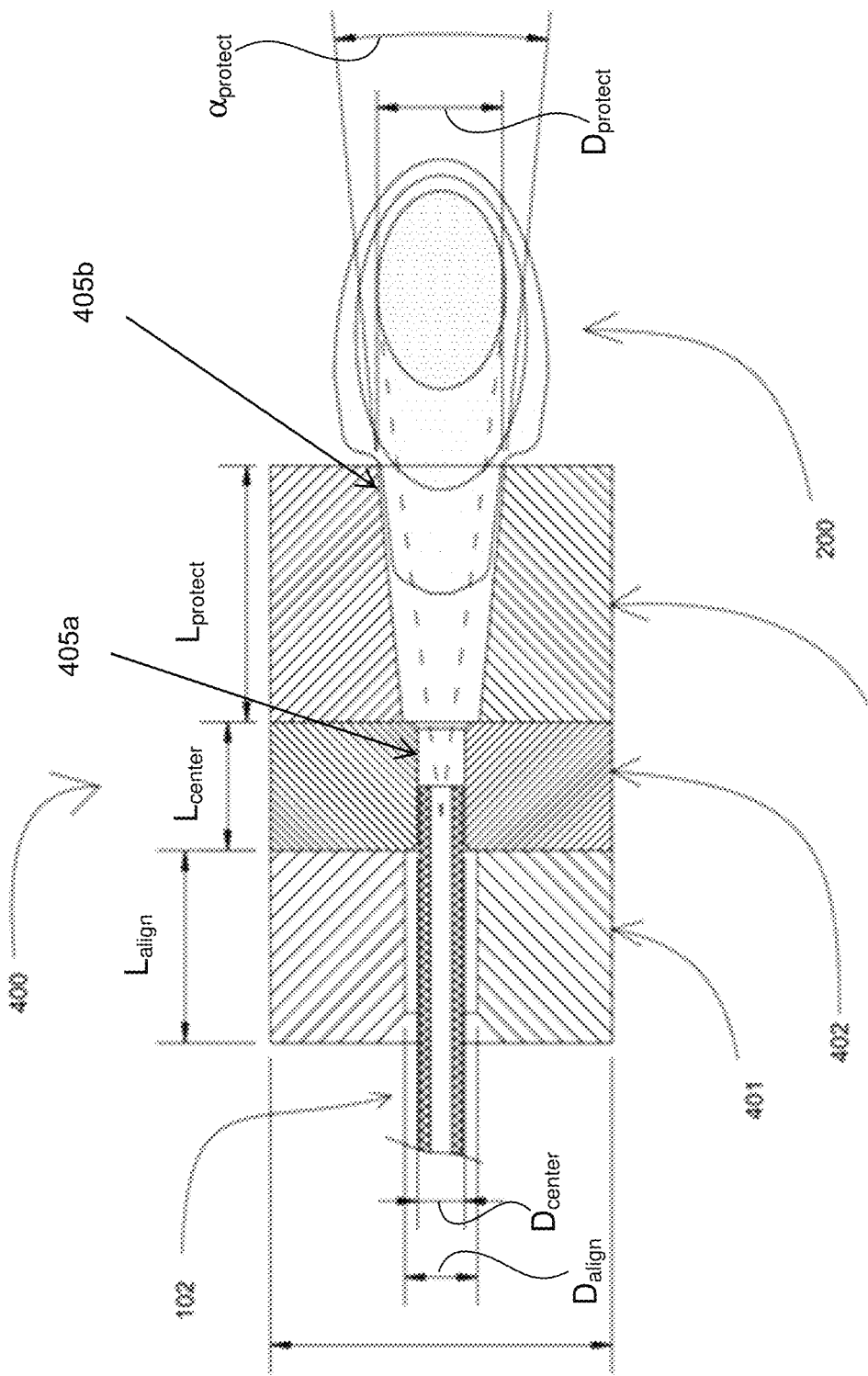
FIG. 11 depicts an embodiment of a radiation source.

FIG. 11 illustrates a configuration according to a further embodiment, which aims to reduce the flux of corrosive/contaminating species at the fiber's end and/or to suppress plasma/radical induced deposition and polymerization (e.g., so as to suppress the growth of GGP). The arrangement comprises a surface 405a, 405b defined by the internal wall of a self-aligned, self-centering output element 400. This surface 405a, 405b is defined so as to not obstruct and/or absorb the radiation output from the fiber (e.g., defined to account for the NA, optionally with an additional margin, for example 30-300 or 50-250 μm). As an alternative to this margin, or additionally thereto, a mirror finish may be provided to one or both of surface 405a and surface 405b.

The output element 400 may extend beyond the fiber's end facet by a sufficient distance to help ensure the radiation-induced plasma 200 (center for active species generation) is maintained far enough from the output of fiber 102 to reduce or prevent significant etching from the fiber, thereby suppressing the source for GGP. This distance may be, for example, at least 3 times the inner width (e.g., diameter) $D_{protect}$ of the output element 400 at its output end (e.g., between 3× and 30× this). In this way, the output element 400 provides sufficient distance between unconstrained plasma and the output facet of the fiber 102 so that no (or very little) plasma-induced reactions and deposition of contaminants occur.

In an embodiment, the output element 400 may comprise multiple sections (optionally composite), which may comprise:

- a self-aligning section 401. The width (e.g., diameter) $D_{align}$ of the self-aligning section 401 may be defined as, e.g.: $D_{align} \cong D_{fiber} + 0.1 \ldots 0.5$ mm (where $D_{fiber}$ is the fiber width (e.g., diameter)). The length of this section may be, e.g., $L_{align} \cong 2 \ldots 20$ mm.
- a self-centering section 402. The width (e.g., diameter) $D_{center}$ of the self-centering section 402 may be defined as e.g.: $D_{center} \cong D_{fiber} + 50 \ldots 250$ μm. Its length may be, e.g., $L_{center} \cong 0.3 \ldots 3$ mm $\cong 1 \ldots 10*D_{fiber}$.
- a protective element section 403 comprising a protective element or shield. The length $L_{protect}$ of this shield may be, e.g.: $L_{protect} \geq 3*D_{protect}$; $D_{protect} \cong L_{protect} * \alpha_{protect} + D_{fiber} + 0 \ldots 3$ mm; $\alpha_{protect} \geq NA$).

One or more of the sections 401, 402, 403 may be one or two side tapered. Although output element 400 is shown having axial symmetry, asymmetrical or planar-symmetrical elements (or one or more sections 401, 402, 403 thereof) are also possible.

One or both of sections 401 and 402 are optional, and their functions may be provided by fiber support components.

Protective element section 403 and the fiber's end facet may be arranged such that the end facet and the section 403 input cross-section are within 1 mm, or within 0.1-0.01 mm of each other, and that radiation output from the fiber is not obstructed by the protective element section 403.

In an embodiment, the protecting apparatus may be composite; e.g., with the sections 401, 402, 403 aligned by common rods or screws. To facilitate this, it is proposed that precise channels are formed/drilled with sufficiently small diameter (e.g., smaller than 10 μm or smaller than 5 μm) by laser drilling using, e.g., a picosecond laser, by reactive-ion engineering or using a focused ion beam.

The output element 400 may be aligned and centered to the optical fiber using support structures referenced to the gas cell or to another auxiliary support, e.g., such that the fiber end facet is within 1 mm, or within 0.1 mm from the cross-section of the protecting element and the inner surface angle of the protective element section 403 is within 0.1 rad, desirably within 0.01 rad of the NA of the radiation output from the fiber.

In an optional embodiment, it is proposed to suppress sputtering of the surface, shield or output element material and/or eliminate redeposition-induced structures from the material of the apparatus (should they emerge at the output of apparatus instead of GGP). Such a method may comprise selecting a material surface, shield or output element which is not subject to (or has little) chemical sputtering in presence of active hydrogen species. Such materials may comprise metals, for example: Mo, W, stainless steel or other metal, mix of metals or alloy. Alternatively or in addition, the material may be chosen to have lower sputtering yield by noble gas ions (e.g., C, Ti, V). The fact that the surface, shield or output element material may be made of or comprise a different material than the fiber may further increase the fiber life as plasma attacks and/or deposits silicon faster than for some other materials.

Another approach may comprise selecting a material which is stable (non-oxidizing after sputtering and possible redeposition) and, optionally, has a melting temperature below the melting temperature of the fiber (e.g., glass). Such a material may comprise a noble metal, e.g., Au or Ag. Such an approach may comprise allowing (e.g., periodic) melting of formed structures (e.g., fluffy structures) of such a material (e.g., created during re-deposition) either by absorption of radiation (output from the fiber itself), or by an external heater.

In an embodiment, the surface material may form or comprise a volatile oxide and hydride, such as C (the piece may be made of or coated with amorphous carbon, diamond-like carbon or diamond, or $C_3N_4$). In this embodiment, fluffy structures initiated by the plasma may be (e.g., periodically) oxidized e.g., by injection of $O_2/H_2O/H_2O_2$ or other suitable oxidizing agent within the fiber environment.

Such approaches allow self-cleaning or periodic removal of forming structures, without a downtime penalty.

The proposed material in these embodiments may be deposited as a coating to the surface, e.g., with a thickness 1-100 μm, at least where the surface is in contact with the plasma. Such a coating may be applied to any of the surfaces described in relation to FIGS. 7 to 11.

While each embodiment of the radiation source in FIGS. 7-11 have been disclosed separately, it may be desirable to combine one or more features of an embodiment with one or more features of another embodiment to arrive at a different combination of features than as explicitly depicted. For example, it may be desirable to provide a surface using some combination of a shield and the inner surface of the gas cell. A configuration of the surface disclosed to be provided by a shield may be instead provided by the inner surface of the gas cell, and vice versa. Also, for example, the self-aligning section and/or self-centering sections of FIG. 11 may be used with the embodiments of FIG. 7 or 8.

Where a separate shield or protective element is used, the fiber end may be adjacent to the shield or protective element or inserted into the shield or protective element.

In all embodiments, the gas cell may comprises a gas inlet and gas outlet arranged such that, when a pressure difference is established between the gas inlet and gas outlet of the fiber, a gas flow is established which removes volatile species, prevents re-deposition of concentrated/polymerized species, reduces the pressure at the optical output and/or suppresses plasma induced by radiation absorption. Also, such an arrangement provides an option to introduce a pressure (and density) gradient such that dispersion may be tuned additionally. Furthermore there will be a possibility to tune a flow and pressure profile, such that the steady state pressure in the low pressure vessel is significantly reduced, for example <1 bar, desirably <0.1 bar. This means that laser pulse and generated supercontinuum pulse absorption by the gas will be minimized and plasma ignition at the output end of the fiber is suppressed. For example, there may be two pressurized vessels at either end of the fiber and a pressure difference established between the two vessels (e.g., maintained using an external apparatus).

Further embodiments are disclosed in the subsequent numbered list of clauses:

1. A light source, comprising:
a gas cell having an optical output;
an optical fiber that is hollow and has an axial direction, an end thereof being enclosed within the gas cell and optically coupled to the optical output via an optical path;
a surface disposed around the end of the optical fiber, and extending past the end of the optical fiber in the axial direction towards the optical output so as to limit one or more selected from:
the exchange of gas between the optical path and the remainder of the gas cell,
ingress of plasma towards or into the optical fiber, and/or
radical flux towards etch-susceptible surfaces.
2. A light source according to clause 1, wherein the surface is provided by the inner surface of the gas cell.
3. A light source according to clause 1, wherein the surface is not provided by the inner surface of the gas cell, and the surface is provided by a protective element.
4. A light source according to clause 3, wherein a length between the end of the optical fiber and an output end of the protective element is sufficient to prevent or limit ingress of plasma into the optical fiber.
5. A light source according to clause 4, wherein the length between the end of the optical fiber and the output end of the protective element is at least three times an outer diameter of the optical fiber.
6. A light source according to clause 5, wherein a minimum cross section of the protective element is in the range of 0.1 to 10 times the outer diameter of the optical fiber.
7. A light source according to clause 5 or clause 6, wherein an inner surface of the protective element is arranged to not obstruct light output from the optical fiber.

8. A light source according to clause 7, wherein the inner surface of the protective element has an opening angle in the range of 0.5 to 5 times the numerical aperture (NA) of the optical fiber.

9. A light source according to any of clauses 3 to 8, wherein the protective element comprises part of an output element, and further comprising one or both of a self-alignment section and self-centering section.

10. A light source according to clause 9, wherein a diameter of the self-alignment section is between 0.1 and 0.8 mm larger than a diameter of the optical fiber, and/or a length of the self-alignment section is at least 1 mm.

11. A light source according to clause 9 or clause 10, wherein a diameter of the self-centering section is between 50 μm and 250 μm larger than a diameter of the optical fiber.

12. A light source according to any of clauses 9 to 11, wherein the output element is a composite output element where the protective element and one or both of the self-alignment section and self-centering section are separately formed.

13. A light source according to any of clauses 9 to 12, wherein the protective element and one or both of the self-alignment section and self-centering section are aligned with common rods and/or screws.

14. A light source according to any of claims 3 to 13, wherein an inner surface of the protective element is arranged within 10-1000 μm from a light cone output from the optical fiber for at least a part of the protective element adjacent to the optical output.

15. A light source according to any of the preceding clauses, wherein the surface extends along the optical fiber for a given length, and the surface is offset from the circumference of the optical fiber, forming a gap.

16. A light source according to any of the preceding clauses, wherein the gap between the optical fiber and the surface has a minimum cross-sectional area normal to the axial direction between 100 μm$^2$ and 3 mm$^2$.

17. A light source according to any of clauses 1 to 3, wherein the surface abuts or is sealed to the optical fiber.

18. A light source according to any of clauses 3 to 14, wherein the protective element abuts or is sealed to the optical output, or the gas cell surface containing the optical output.

19. A light source according to any of clauses 1 to 18, wherein the optical output comprises a window.

20. A light source according to any of clauses 1 to 19, wherein the surface comprises silica, a metal, a metal alloy, a noble metal, a metal oxide, a nitride, a carbide, a boride, a silicide, silicon, or other semiconductor.

21. A light source according to any of clauses 1 to 20, wherein the surface comprises a material which limits or is not subject to chemical sputtering in presence of active hydrogen species.

22. A light source according to clause 21, wherein the material comprises molybdenum or tungsten or stainless steel.

23. A light source according to any of clauses 1 to 22, wherein the surface comprises a material having a lower sputtering yield by noble gas ions than the optical fiber.

24. A light source according to any of clauses 1 to 23, wherein the surface comprises a material which is stable and non-oxidizing after any sputtering.

25. A light source according to any of clauses 1 to 24, wherein the surface comprises a material having a melting temperature below the melting temperature of the optical fiber.

26. A light source according to clause 25, wherein the material comprises a noble metal.

27. A light source according to any of clauses 1 to 26, wherein the surface comprises a material that forms both a volatile oxide and a volatile hydride.

28. A light source according to clause 27, wherein the material comprises amorphous carbon, diamond-like carbon, diamond, or $C_3N_4$.

29. A light source according to any of clauses 21 to 29, wherein the material is applied as a coating to the surface.

30. A light source according to any of clauses 1 to 29, wherein the surface comprises a mirror coating.

31. A light source according to any of clauses 1 to 30, wherein the gas cell comprises a gas inlet and gas outlet arranged such that, when a pressure difference is established between the gas inlet and gas outlet of the fiber, a gas flow is established which removes volatile species, prevents re-deposition of concentrated/polymerized species, reduces the pressure at the optical output and/or suppresses plasma induced by light absorption.

32. A light source according to any of clauses 1 to 31, wherein the surface defines a rotationally symmetric shape in the axial direction.

33. A light source according to any of clauses 1 to 32, wherein the surface defines a diameter normal to the axial direction that is non-constant, optionally the diameter defined by the surface is larger than:

$$D_{min} = w_0 \sqrt{1 + (z/z_R)^2}$$

where $w_0$ is the mode field diameter at the end of the optical fiber, z is the distance from the end of the optical fiber, and $z_R$ is the Rayleigh length.

34. A light source according to any of clauses 1 to 33, wherein the surface defines a frustro-conical shape, at least along a portion of its length.

35. A light source according to any of clauses 1 to 34, wherein the gas in the gas cell comprises at least one gas selected from: helium, neon, argon, krypton, xenon, hydrogen, oxygen, nitrogen, or mixtures thereof.

36. A light source according to any of clauses 1 to 35, wherein the optical fiber is coupled to an optical source, the optical source comprising a pump laser.

37. A metrology device comprising the light source of any of clauses 1 to 36, wherein the light source is configured to generate light for projection onto a substrate.

38. The device of clause 37, wherein the metrology device is a scatterometer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

While specific embodiments of the invention have been described above, it will be appreciated that the invention may be practiced otherwise than as described. The light source disclosed herein, for example, may have applications outside of a metrology device or lithography device, e.g., it may be used for applications in medical and cosmetic diagnostics and imaging, catheter-based interventions (cardio, renal and more), skin treatments (e.g., inter alia targeting blood vessels and tattoo removal) and material imaging and material processing.

The descriptions above are intended to be illustrative, not limiting. Thus it will be apparent to one skilled in the art that modifications may be made to the invention as described without departing from the scope of the claims set out below.

The invention claimed is:

1. A radiation source, comprising:
    a gas cell having a window;
    an optical fiber that is hollow and has an axial direction, an end thereof being enclosed within the gas cell and optically coupled to the window via an optical path;
    a surface disposed around the end of the optical fiber, and extending past the end of the optical fiber in the axial direction towards the window so as to limit one or more selected from:
        the exchange of gas between the optical path and the remainder of the gas cell,
        ingress of plasma towards or into the optical fiber, and/or
        radical flux towards etch-susceptible surfaces.

2. The radiation source according to claim 1, wherein the surface is provided by the inner surface of the gas cell.

3. The radiation source according to claim 1, wherein the surface is not provided by the inner surface of the gas cell, and the surface is provided by a shield.

4. The radiation source according to claim 3, wherein the shield abuts or is sealed to the window, or the gas cell surface containing the window.

5. The radiation source according to claim 1, wherein the surface extends along the optical fiber for a given length, and the surface is offset from the periphery of the optical fiber, forming a gap.

6. The radiation source according to claim 1, wherein a gap between the optical fiber and the surface has a minimum cross-sectional area normal to the axial direction between 100 μm² and 3 mm².

7. The radiation source according to claim 1, wherein the surface abuts or is sealed to the optical fiber.

8. The radiation source according to claim 1, wherein the surface comprises silica, a metal, silicon, or other semiconductor.

9. The radiation source according to claim 1, wherein the surface defines a rotationally symmetric shape in the axial direction.

10. The radiation source according to claim 1, wherein the surface defines a cross-sectional width normal to the axial direction and along the surface that is non-constant.

11. The radiation source according to claim 1, wherein the surface defines a diameter normal to the axial direction that is larger than:

$$D_{min} = w_0 \sqrt{1 + \left(\frac{z}{z_R}\right)^2}$$

where $w_0$ is the mode field diameter at the end of the optical fiber, z is the distance from the end of the optical fiber, and $z_R$ is the Rayleigh length.

12. The radiation source according to claim 1, wherein the surface defines a frustro-conical shape.

13. The radiation source according to claim 1, wherein the gas in the gas cell comprises at least one gas selected from: helium, neon, argon, krypton, xenon, hydrogen, oxygen, nitrogen, or a mixture thereof.

14. The radiation source according to claim 1, wherein the optical fiber is coupled to an optical source, the optical source comprising a pump laser.

15. The radiation source according to claim 1, wherein the surface is provided by a part of an output element, and further comprising a self-alignment section and/or self-centering section of the output element.

16. The metrology device of claim 15, wherein the metrology device is a scatterometer.

17. The radiation source according to claim 1, wherein the surface comprises a material which limits or is not subject to chemical sputtering in presence of active hydrogen species.

18. The radiation source according to claim 1, wherein the surface comprises a material that forms both a volatile oxide and a volatile hydride.

19. The radiation source according to claim 1, wherein the surface comprises a mirror coating.

20. A metrology device comprising the radiation source of claim 1, wherein the radiation source is configured to generate radiation for projection onto a substrate.

* * * * *